(12) United States Patent
Leroux

(10) Patent No.: US 6,671,048 B1
(45) Date of Patent: Dec. 30, 2003

(54) METHOD FOR DETERMINING WAFER MISALIGNMENT USING A PATTERN ON A FINE ALIGNMENT TARGET

(75) Inventor: Pierre Leroux, San Antonio, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/425,834

(22) Filed: Oct. 21, 1999

(51) Int. Cl.[7] .............................................. G01B 11/00
(52) U.S. Cl. ...................................................... 356/401
(58) Field of Search ............................... 356/399, 400, 356/401

(56) References Cited

U.S. PATENT DOCUMENTS

| | | | |
|---|---|---|---|
| 5,545,593 A | | 8/1996 | Watkins et al. ............. 437/225 |
| 5,672,520 A | * | 9/1997 | Natsume ..................... 356/401 |
| 6,015,744 A | * | 1/2000 | Tseng .......................... 257/797 |
| 6,229,618 B1 | * | 5/2001 | Tomimatu ................... 356/401 |

FOREIGN PATENT DOCUMENTS

WO   WO 86/04158   7/1986   ........... G03B/41/00

OTHER PUBLICATIONS

Magdo S.: "Registering Marks for Semiconductor Fabrication Masks Sep. 1970." IBM Technical Disclosure Bulletin, vol. 13, No. 4, Sep. 1, 1970, pp. 955–956, XP002168298 New York, US the whole document.

* cited by examiner

Primary Examiner—Frank G. Font
Assistant Examiner—Andrew H. Lee
(74) Attorney, Agent, or Firm—Peter Zawilski

(57) ABSTRACT

A method for determining wafer misalignment by using a pattern on a fine alignment target. In one embodiment, the method comprises a series of steps in a stepper, starting with the step of receiving a wafer having an alignment target. In another step, the wafer is aligned using the alignment target. Next, a pattern is created around the alignment target using an overlay. Then, the misalignment is determined between the alignment target and the pattern created around the alignment target.

21 Claims, 10 Drawing Sheets

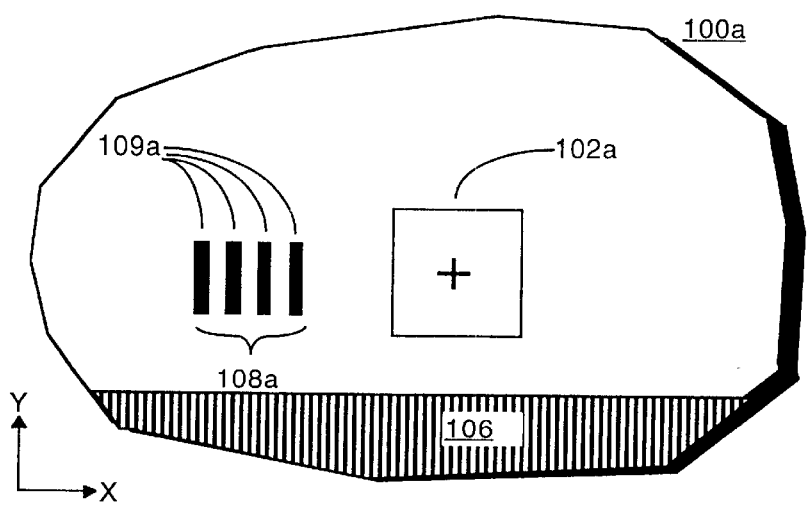
Prior Art Fig. 1A
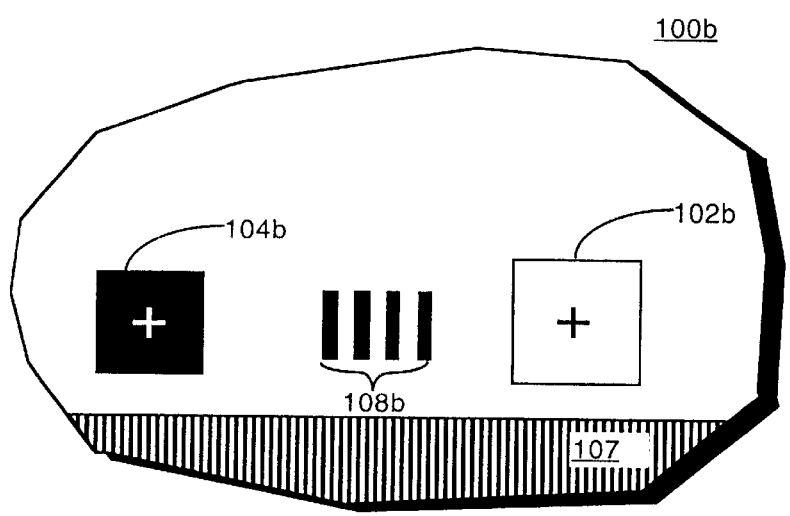
Prior Art Fig. 1B

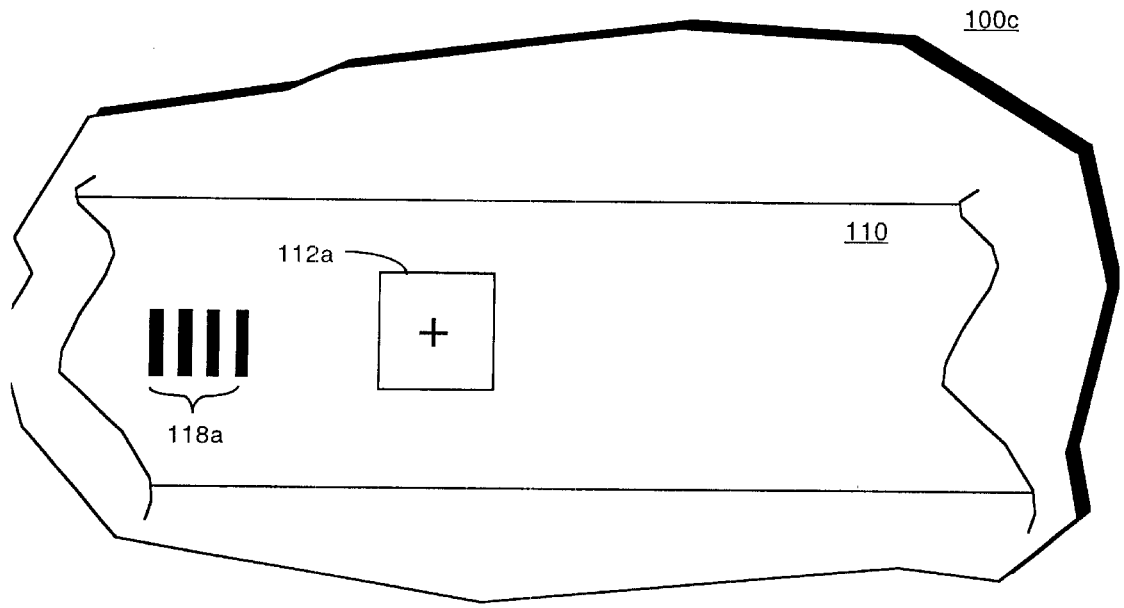
Prior Art Fig. 1C
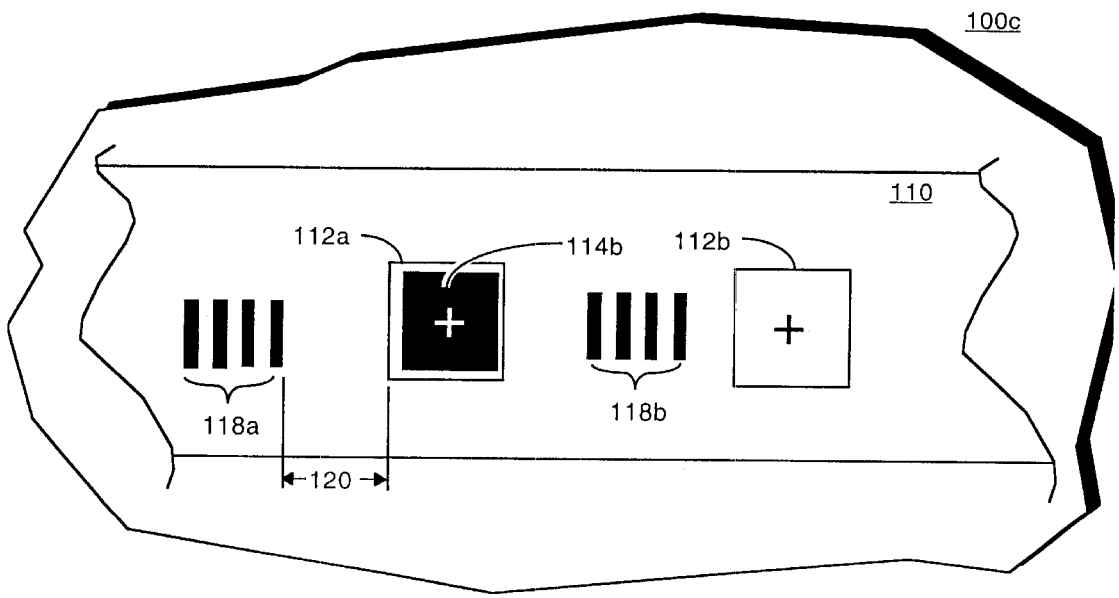
Prior Art Fig. 1D

View A-A

View A-A

METHOD FOR DETERMINING WAFER MISALIGNMENT USING A PATTERN ON A FINE ALIGNMENT TARGET

TECHNICAL FIELD

The present claimed invention relates to the field of semiconductor wafer fabrication. Specifically, the present claimed invention relates to a method for determining wafer misalignment using a pattern on a fine alignment target.

BACKGROUND ART

Integrated circuits (ICs) are fabricated en masse on silicon wafers using well-known photolithography, etching, deposition, and polishing techniques. These techniques are used to define the size and shape of components and interconnects within a given layer built on a wafer. The IC is essentially built-up using a multitude of interconnecting layers, one formed on top of another.

Accurate formation of an image on a wafer using photolithography involves several categories. One of the most important categories is alignment. Precise alignment between the succeeding layers formed on the wafer is critical. For example, precise alignment is necessary to accurately couple interconnects, to ensure proper location of insulators, and to accurately shape and size devices to achieve proper performance. Hence, a need arises for ensuring accurate alignment of multiple layers formed on a wafer.

Referring now to Prior Art FIG. 1A, a reticle 100a having multiple patterns is presented. Reticle 100a uses a conventional alignment pattern. Specifically, the alignment pattern includes a fine alignment target 108a, an overlay box 102a, and a product wafer pattern 106. Product wafer patterns form the devices and interconnections in a layer of material on the wafer, while the conventional alignment patterns 108a and 102a provide patterns in the layer of material on the wafer by which subsequent layers of material on the wafer may be accurately aligned.

The conventional alignment pattern shown in prior art FIG. 1A uses two separate kinds of features to accomplish alignment and measurement of misalignment. The first feature is an alignment target 108a, that typically includes a plurality of rectangles 109a. The second feature is an overlay box 102a. In the present case, only a large overlay box 102 is shown. Alignment target 108a is used to coarsely align a wafer in a stepper machine for a subsequent fabrication operation. Subsequent to the initial placement of the wafer, images or structures are created on the wafer using two separate overlay box patterns. Box 102a is the large version of the two boxes used for the misalignment measurement.

Referring now to prior art FIG. 1B, a reticle with an alignment pattern that complements the pattern of prior art FIG. 1A is shown. The alignment pattern of prior art FIG. 1B is used to create structures on the wafer following the application of the prior art FIG. 1A pattern on the wafer. Alignment pattern of prior art FIG. 1B includes small overlay box 104b, fine alignment target 108b, and large overlay box 102b.

Referring now to prior art FIG. 1C, a wafer having a conventional alignment target and a conventional large overlay box is shown. Conventional alignment target 118a and large overlay box 112a is typically formed in a scribe line 110 of a product wafer so as not to interfere with the product patterns, e.g. ICs, formed on the dies. Reticle 100a of prior art FIG. 1A is used to form alignment target 118a and large overlay box 112a in wafer 100c.

Referring now to prior art FIG. 1D, a wafer having conventional alignment targets and conventional small and large overlay boxes formed therein is shown. Wafer 100c of FIG. 1D is the same wafer 100c of FIG. 1C, but with new structures formed thereon, typically on a next layer of material deposited on the wafer. Reticle 100b of prior art FIG. 1B is used to form new structure such as small overlay box 114b, fine alignment target 118b, and large overlay box 112b. By examining the alignment between large overlay box 112a and small overlay box 114b, an alignment error, e.g. unequal gap between the boxes, and subsequent correction can be determined. For each subsequent product pattern formed on a new layer of material, a reticle such as the one in prior art FIG. 1B, can be used to form the new pattern of a small overlay box, a fine alignment target, and a large overlay box. However, by requiring all these structures for each layer, a great deal of space in the scribe line 110 is consumed. This space within the scribe line 110 is highly sought after for implementing structures and processes that monitor fabrication operations on the wafer, besides alignment. For example, functional structure is often created within the scribe lines to evaluate the electrical performance of each layer during the fabrication operation. As a result of these limitations, a need exists to reduce the size and quantity of the alignment structures, and the space which they consume, on the wafer.

Additionally, the conventional method of using separate components for aligning and measuring misalignment confounds the misalignment measurement. Specifically, the conventional method, as shown in prior art FIG. 1A through FIG. 1D, uses an alignment target structure for aligning the wafer in the stepper, and uses a separate set of overlay boxes for measuring the misalignment. Because of the offset 120 between the two structures, confounding errors can arise. For example, lens aberration or rotational error will be different for different areas of the reticle projected onto different areas of the wafer. Consequently, the misalignment measurement between large overlay box 112a and small overlay box 114b on wafer 100c might include an error caused by lens aberration. That is, a lens aberration existing in the area corresponding to the overlay boxes, that does not exist for the fine alignment target, will confound the results of the alignment process. That is, if the same lens aberration did not exist at the location of the fine alignment target, then additional error is included in the misalignment measurement. If a misalignment correction is made to align the boxes, based on the confounded misalignment measurement, then the balance of the patterns formed by the reticle may be incorrectly aligned. Consequently, a need arises for a method and apparatus that more accurately determines misalignment.

In the prior art, alignment between two different patterns on two different layers was not directly tied together. Instead, each layer was aligned to the previous layer. Hence, the misalignment error would accumulate over the quantity of layers that separated the two layers that required close alignment to each other. The accumulation of misalignment can result in an unacceptable error for a given device formed on a wafer. Hence, a need arises for a method and apparatus providing very accurate alignment between two patterns on two different layers on a wafer, regardless of the quantity of layers between them.

In summary, a need arises for ensuring accurate alignment of multiple layers formed on a wafer. Additionally, a need exists to reduce the size and quantity of the alignment structures, and the space which they consume, on the wafer. And, a need arises for a method and apparatus that more accurately determines misalignment. Furthermore, a need arises for a method and apparatus providing very accurate alignment between two patterns on two different layers on a wafer, regardless of the quantity of layers between them.

DISCLOSURE OF THE INVENTION

The present invention provides a method and apparatus for ensuring that the different layers of an IC that are formed on a wafer are accurately formed. Furthermore, the present invention ensures accurate alignment of multiple layers formed on a wafer. Additionally, the present invention provides a method that directly checks for misalignment between the layer formed by an overlay in a stepper to the alignment targets on the wafer. The present invention also reduces the size and quantity of the alignment structures, and the space which they consume, on the wafer. And the present invention provides a method and apparatus providing very accurate alignment between two patterns on two different layers on a wafer, regardless of the quantity of layers between them.

In one embodiment, the present invention recites a method for determining misalignment between a wafer and a reticle by using a pattern on a fine alignment target. In one embodiment, the method comprises a series of steps, starting with receiving a wafer having an alignment target formed on it. In another step, the wafer is aligned using the alignment target. Next, a pattern from a reticle is created on the wafer around the existing alignment target on the wafer. Then, the misalignment is determined using the alignment target and the pattern created around the alignment target.

In another embodiment, the present invention recites a stepper including a processor and a computer readable memory. The memory contains program instructions that, when executed over the processor, implement the method of determining an alignment error between an overlay and an alignment target.

These and other objects and advantages of the present invention will no doubt become obvious to those of ordinary skill in the art after having read the following detailed description of the preferred embodiments illustrated in the various drawing figures.

BRIEF DESCRIPTION OF THE DRAWINGS

The accompanying drawings, which are incorporated in and form part of this specification, illustrate embodiments of the invention and, together with the description, serve to explain the principles of the invention:

PRIOR ART FIG. 1A is a reticle having a conventional large overlay box and a conventional fine alignment target.

PRIOR ART FIG. 1B is a reticle having a conventional small and large overlay box and a conventional fine alignment target.

PRIOR ART FIG. 1C is a wafer with a conventional large overlay box and a conventional fine alignment target formed therein.

PRIOR ART FIG. 1D is a wafer with a conventional small and large overlay box and a conventional fine alignment target formed therein.

The drawings referred to in this description should be understood as not being drawn to scale except as specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention can be practiced without these specific details. In other instances, well-known methods, procedures, components, and materials have not been described in detail so as not to unnecessarily obscure aspects of the present invention.

Some portions of the detailed descriptions which follow, e.g. the processes, are presented in terms of procedures, logic blocks, processing, and other symbolic representations of operations for wafer fabrication, e.g. fabricating ICs on a wafer. These descriptions and representations are the means used by those skilled in the art of wafer fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Usually, though not necessarily, these physical manipulations take the form of applying material, removing material, or changing the state or structure of a material on a wafer by chemical, optical, and mechanical means.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussions, it is understood that throughout discussions of the present invention, terms such as or "receiving," "aligning," "creating," "determining," "measuring," "repeating," or the like, refer to the action and processes of wafer fabrication.

Figure 2A:
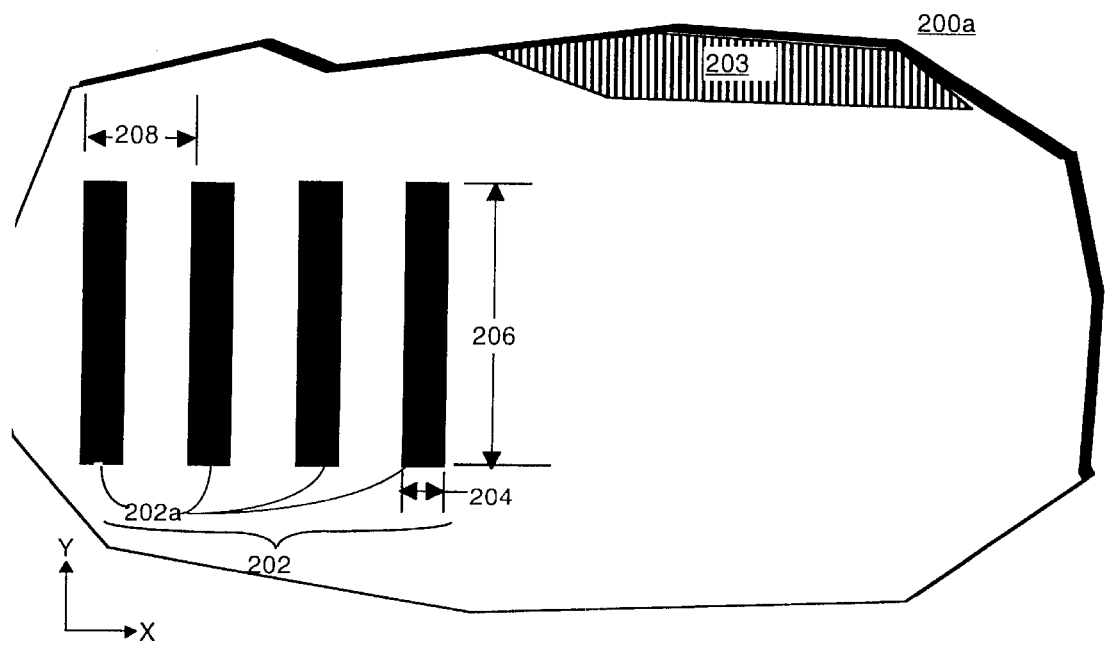
FIG. 2A is a reticle with a fine alignment target, in accordance with one embodiment of the present invention.

Referring now to FIG. 2A, a reticle 200a with a fine alignment target 201 is shown, in accordance with one embodiment of the present invention. Fine alignment target 202 includes multiple individual rectangle shapes 202a. While the present embodiment uses a rectangle shape for the fine alignment target, the present invention is well-suited to using any shape object for an alignment target. Each rectangle 202a has a height 206 and a width 204. The pitch 208, between rectangles 202a in alignment target 202 is constant in the present embodiment. However, the present invention is well-suited to having a pitch 208 that is different between each subsequent alignment target. While alignment targets are shown with a specific orientation, e.g. the long side of the rectangle is oriented vertically, the present invention is well-suited to orientating an alignment target in any direction. While the present embodiment of reticle 200a includes a product pattern 203 for creating patterns on the die portion of a wafer, the present invention does not require a product pattern. Also, fine alignment target 202 can be any type of alignment target.

Figure 2B:
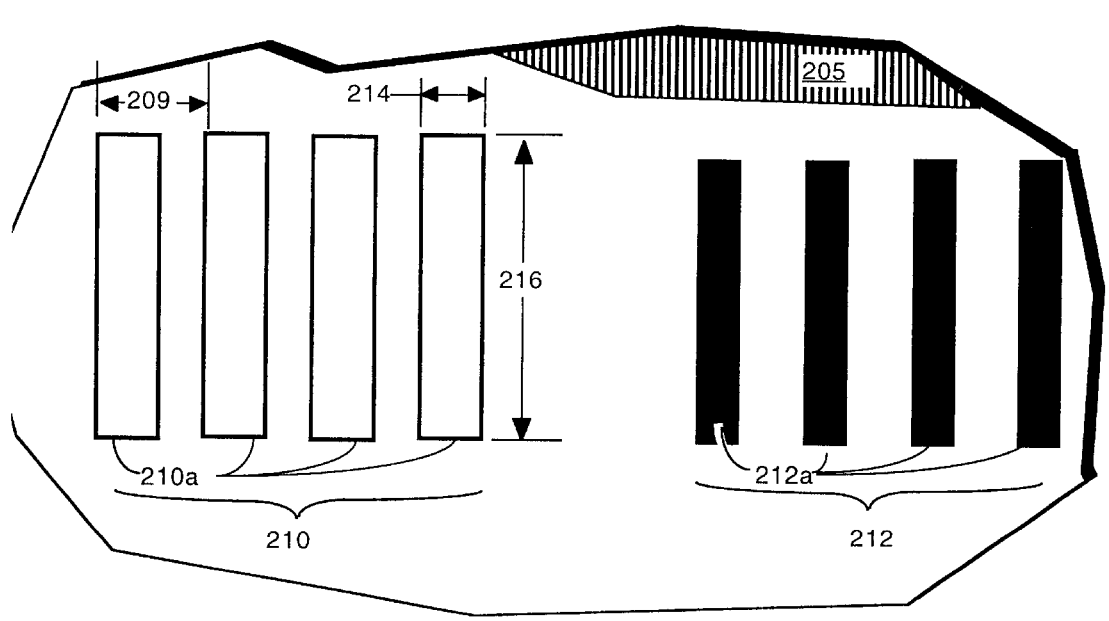
FIG. 2B is a reticle with multiple overlay boxes for application to the fine alignment target, in accordance with one embodiment of the present invention.

Referring now to FIG. 2B, a reticle 200b with multiple overlay boxes 210a and a fine alignment target 212 is shown, in accordance with one embodiment of the present invention. Reticle 200b includes a overlay pattern 210 having multiple overlay boxes 210a. Overlay box 210a has a height 216 and a width 214 that is larger, in one embodiment, than a rectangle 202a of fine alignment target 202a of FIG. 2A. However, the present invention is suitable to reversing the relative sizes of the overlay box and the rectangles in the fine alignment target. Each overlay box 210a is spaced at a pitch that will allow them to overlay rectangles 202a in fine alignment target 202 of FIG. 2A, when applied to a wafer. Reticle 200b also includes a new fine alignment target 212 that includes multiple rectangles 212a. In one embodiment, new fine alignment target 212 is identical to fine alignment target 201 used in reticle 200a of FIG. 2A.

Figure 2C:
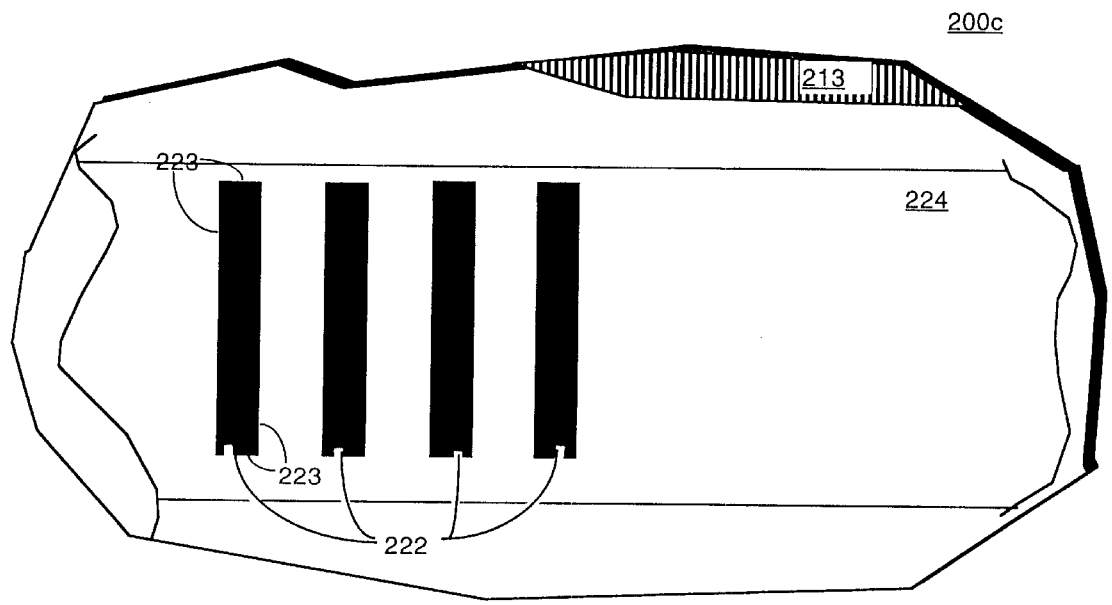
FIG. 2C is a wafer with a fine alignment target formed therein, in accordance with one embodiment of the present invention.

Referring now to FIG. 2C, a wafer 200c with a fine alignment target 222 formed therein, in accordance with one embodiment of the present invention. The present embodiment locates fine alignment target 222 in a scribe line 224 of wafer 200c, so as to not consume space on the production dies used for forming an IC. However, the present invention is suitable to placing fine alignment target 222 anywhere on wafer 200c. The present embodiment also shows product pattern 213 formed in wafer 200c. Product patterns corresponds to the pattern etched in to a die portion of a wafer. However, the present invention does not require a product pattern. Fine alignment target 222 can also be referred to as a master fine alignment target, when overlay boxes from multiple reticles, used for different layers on the wafer, are applied to portions of the same alignment target. In this case, the fine alignment target is literally used as a master reference, as described hereinafter in Flowchart 500.

Figure 2D:
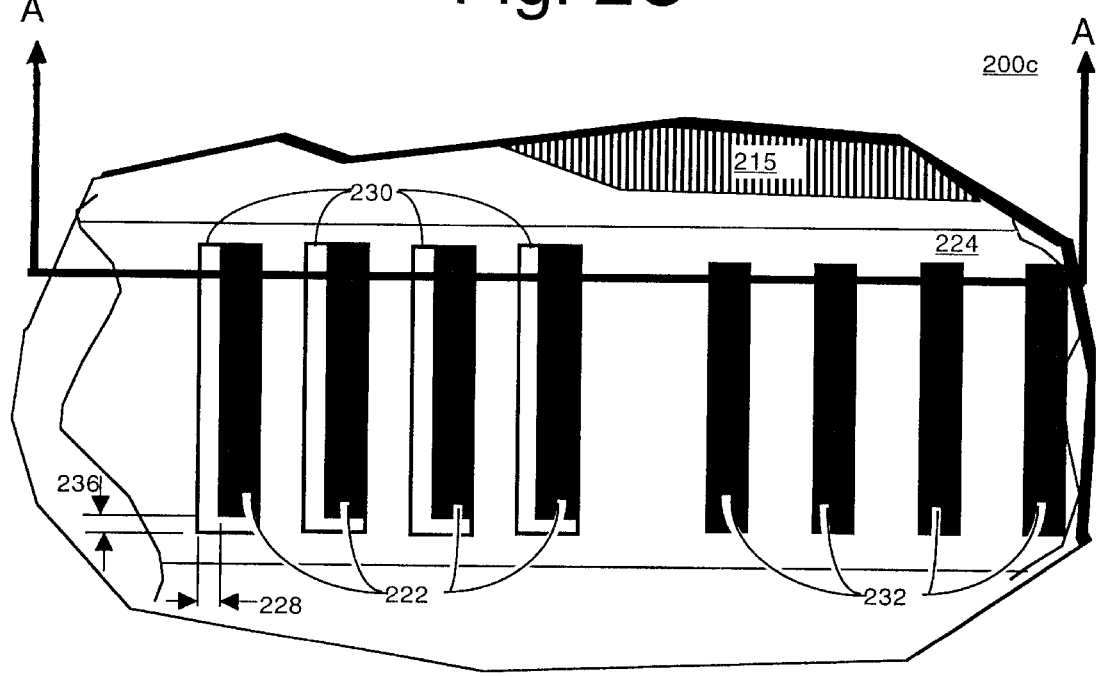
FIG. 2D is a wafer with multiple fine alignment targets and multiple overlay boxes formed therein, in accordance with one embodiment of the present invention.

Referring now to FIG. 2D, wafer 200c with multiple fine alignment targets 222 and 232 and with multiple overlay boxes 230 formed therein is shown, in accordance with one embodiment of the present invention. Overlay boxes 230 are located on top of, or around, fine alignment target 222. A misalignment exists between overlay boxes 230 and fine alignment target 222 in this embodiment. Specifically, the misalignment in divided into a y-direction misalignment 236 and an x-direction misalignment 228. The misalignment result should compensate for the difference in size of the one overlay box 230 and the rectangle of the target 222 that it overlies. New fine alignment target 232 is offset from original fine alignment target 222.

Figure 2E:
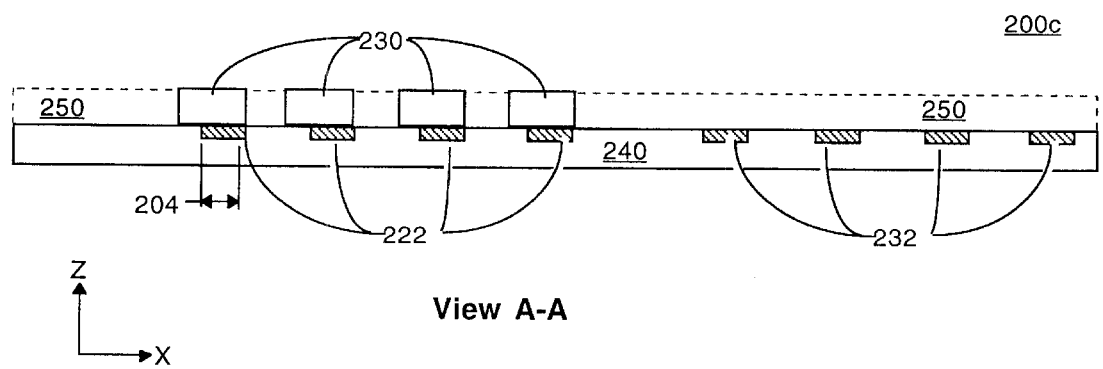
FIG. 2E is a cross-section view of a wafer with one configuration of multiple fine alignment targets and with multiple overlay boxes formed therein, in accordance with one embodiment of the present invention.

Referring now to FIG. 2E, a cross-section view A—A of wafer 200c with one configuration of multiple fine alignment targets and with multiple overlay boxes formed therein is shown, in accordance with one embodiment of the present invention. Wafer 200c shows shapes, or boxes, 222 of fine alignment target formed in layer 240 and overlay boxes 230 formed from layer 250. In this embodiment, the full width 204 of boxes 222 are formed into layer 240. Dashed lines indicate where layer 250 has been etched away to create overlay boxes 230.

Figure 2F:
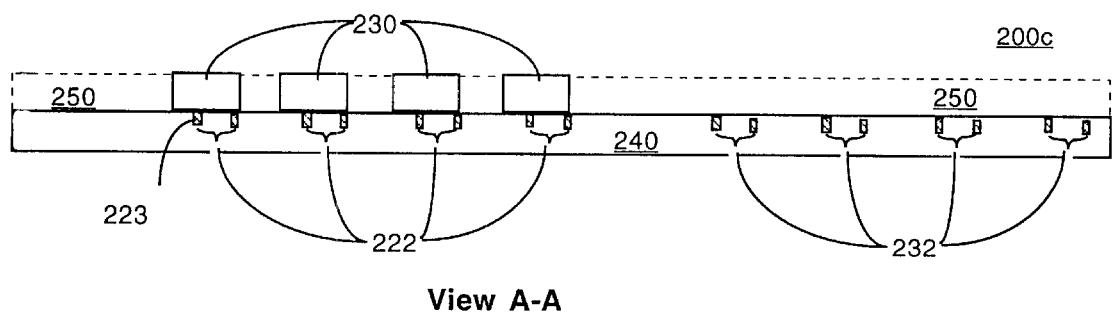
FIG. 2F is a cross-section view of a wafer with another configuration of multiple fine alignment targets and with multiple overlay boxes formed therein, in accordance with one embodiment of the present invention.

Referring now to FIG. 2F, a cross-section view A—A of wafer 200c with another configuration of multiple fine alignment targets and with multiple overlay boxes formed therein is shown, in accordance with one embodiment of the present invention. The embodiment of FIG. 2F is similar to that of FIG. 2E except for the formation of boxes 222 of fine alignment target. In the present embodiment, only the four edges 223 that define the perimeter of boxes 222 of fine alignment target are formed in layer 240 of wafer 200c. The present embodiment provides a clearer defining edge for boxes 222 for the alignment and misalignment measurement process.

Figure 3:
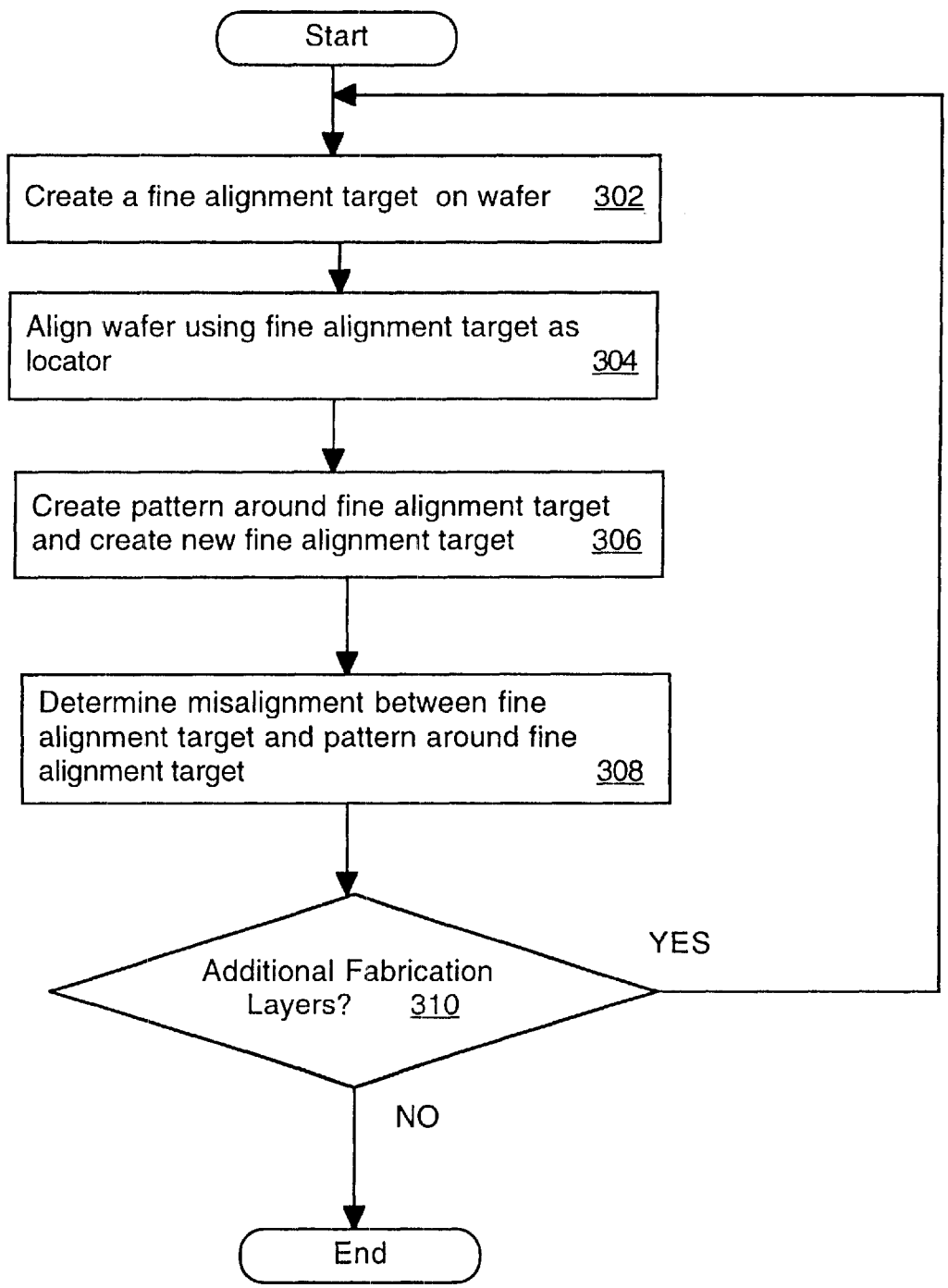
FIG. 3 is a flowchart of the steps performed to sequentially determine misalignment using an alignment target and a pattern, in accordance with one embodiment of the present invention.

Referring now to FIG. 3, a flowchart of the steps performed to sequentially determine misalignment using an alignment target and a pattern, in accordance with one embodiment of the present invention. By using the flowchart embodiment, the present invention provides a more accurate method of determining misalignment of an overlay with an alignment target while consuming less area of the wafer. While the present invention utilizes flowchart 300 in a stepper machine, the present invention is well-suited to using the method of the present invention in any device requiring wafer alignment.

In step 302 of the present embodiment, a fine alignment target is formed on a wafer. FIG. 2C shows one embodiment implementing step 302. In FIG. 2C, fine alignment target 222 is formed in scribe line 224 of wafer 200c. In one embodiment, fine alignment target 222 in wafer 200c is formed using reticle 200a of FIG. 2A. And in another embodiment, the fine alignment target used in flowchart 300 is a conventional fine alignment target. However, the present invention is well-suited to using any configuration or shape of fine alignment target, and any quantity of patterns that make up the fine alignment target. Fine alignment target can be formed in a wide variety of materials on the wafer using a wide variety of well-known techniques. Alternatively, the present invention can receive a wafer already having a fine alignment target formed therein. Following step 302, flowchart 300 proceeds to step 304.

In step 304 of the present embodiment, the wafer is aligned using the fine alignment target as a locator. In another embodiment, the wafer is aligned using more than one alignment target as a locator. In one embodiment, step 304 is used to position the semiconductor wafer as close as possible to the desired location in an apparatus, such as a stepper, for subsequent processing. Step 304 can be implemented as one embodiment using FIG. 2C. That is, fine alignment target 2322 can be used to fine align the wafer in a stepper. Following step 304, flowchart 300 proceeds to step 306.

In step 306 of the present embodiment, a pattern is created around the alignment target. FIG. 2D shows one embodiment implementing step 306 where pattern 230 is created around alignment target 222 in wafer 200c. In one embodiment, pattern 230 is formed in a layer of material overlaying the fine alignment target structure 222 in wafer 200c. Pattern 230, in one embodiment, is an overlay box that is shaped by overlay box pattern 210 of reticle 200b in FIG. 2B.

The present embodiment for step 306 shows the pattern overlying the fine alignment target as having a larger size than fine alignment target. However, the present invention is suitable to using a pattern with a smaller size than fine alignment target. The present invention is also suitable to using any size or shape of pattern over the fine alignment target, if it is accounted for at the misalignment measurement step. Additionally, the present embodiment uses the same quantity of overlay boxes as the quantity of rectangles that make up the fine alignment target. However, the present invention is well-suited to using a quantity of overlay boxes that is independent of the quantity of rectangles or shapes that make up the fine alignment target. This alternative embodiment for step 306 is presented in Flowchart 500. While the present embodiment creates an overlay box around only one of the plurality of shapes of fine alignment target, the present invention could create overlay box over a plurality of shapes of fine alignment target. Furthermore, the present invention is suitable to using any kind of structure or layering on a wafer in order to form the pattern.

Still referring to step 306, a wide variety of embodiments can be used to form the pattern in a wafer. Pattern can be formed using any of the well-known techniques of photolithography, deposition, etching, and polishing to create two structures that surround, or overlay, each other. For example, one embodiment provides a diffusion layer of nitride on a silicon wafer. The alignment targets and the pattern are then formed on the wafer. Subsequent etching, oxide deposition, and chemical mechanical polishing provide a planar top surface for both alignment target and pattern. Following step 306, flowchart 300 proceeds to step 308.

In step 308 of the present embodiment, the misalignment between the alignment target and the pattern is determined. FIG. 2D shows one embodiment implementing step 308. Viewing the top surface of wafer 200c, the misalignment between fine alignment target 222 and overlay boxes 230 is apparent. The misalignment can also be quantitatively evaluated, e.g. using a calibrated overlay tool or using optical sensors with digital signal processing. The misalignment can be segregated into rectangular coordinates in one embodiment, such as vertical misalignment 236 and horizontal misalignment 228. In another embodiment, the misalignment can be segregated using alternative coordinate systems such as cylindrical coordinates. The present embodiment evaluates the misalignment between four rectangles 222 in fine alignment target with four overlay boxes 230. In this manner, an average misalignment value can be obtained. By averaging the results, the present embodiment eliminates some of the 'noise,' or unwanted variation from the actual misalignment value. However, the present embodiment can measure the misalignment based on any quantity of fine alignment target rectangle and overlay box pairs. In one embodiment, the pattern formed around the alignment target is intentionally offset from the rectangular boxes in the fine alignment target, and thus must be considered when determining the misalignment. In another embodiment, no offset is used between alignment target and pattern.

Step 308 is used, in one embodiment, to confirm the accuracy of the initial locating step, e.g. step 304, performed by a stepper on a wafer. Subsequently, the misalignment information obtained from step 308 can provide a correction value to be used in conjunction with step 306 to improve future positioning operations on a wafer. Following step 308, flowchart 300 proceeds to step 310.

In step 310 of the present embodiment, an inquiry determines whether additional fabrication layers are required. If additional fabrication layers are required, then flowchart 300 returns to step 302. In this manner, the method implemented in flowchart 300 can be performed in a serial, or sequential fashion. However, the present invention is well-suited to implementing flowchart 300 in parallel on different areas of the wafer. If additional fabrication layers are not required, then flowchart 300 proceeds to end flowchart 300.

The present embodiment utilizes inquiry step 310 to accommodate multiple operations that typically occur for fabricating an IC on a wafer. For each layer fabricated on the wafer, the present embodiment determines the wafer misalignment using the fine alignment target and pattern. Typically, a new layer uses a new reticle pattern and/or a new stepper. Hence, alignment can be checked for these new components. If step 302 is performed for a subsequent layer on a wafer, one embodiment creates the fine alignment target of step 302 at the time that step 306 is performed. In this embodiment, reticle 200b of FIG. 2B can be utilized. Reticle 200b can be used to create overlay boxes 210a for step 306 of a given layer of material on a wafer, while fine alignment target 212 can be created at the same time to generate a fine alignment target on the wafer for use with the next layer of material.

The present embodiment flowchart 300 shows a specific sequence and quantity of steps. However, the present invention is well-suited to using alternative sequences and alternative quantities of steps. For example, the steps of the present embodiment may be rearranged to realize other benefits of the present invention. Furthermore, some of the steps can be bypassed from, or additional steps may be added to, the present embodiment flowchart to enhance the benefits of the present invention.

Figure 4A:
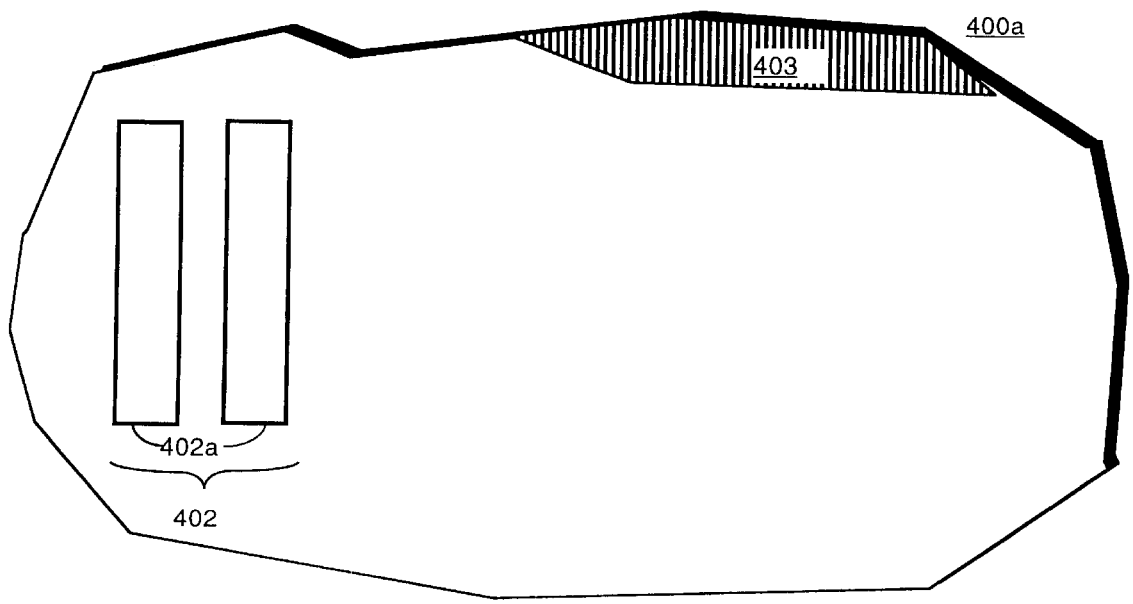
FIG. 4A is a reticle with multiple overlay boxes for use with a master alignment target, in accordance with one embodiment of the present invention.

Referring now to FIG. 4A, a reticle with multiple overlay boxes for a master alignment target is shown, in accordance with one embodiment of the present invention. Reticle 400a includes a pattern 402 having two overlay boxes 402a. Reticle 400a also includes a product pattern 403, of any configuration, that can be used to form an IC on the die portion of a wafer. However, the present invention does not require reticle 400a to have a product pattern 403. While the present embodiment presents a specific quantity, size, and shape of overlay boxes 402a, the present invention is well-suited to using any quantity, size, and shape of overlay boxes 402a.

Figure 4B:
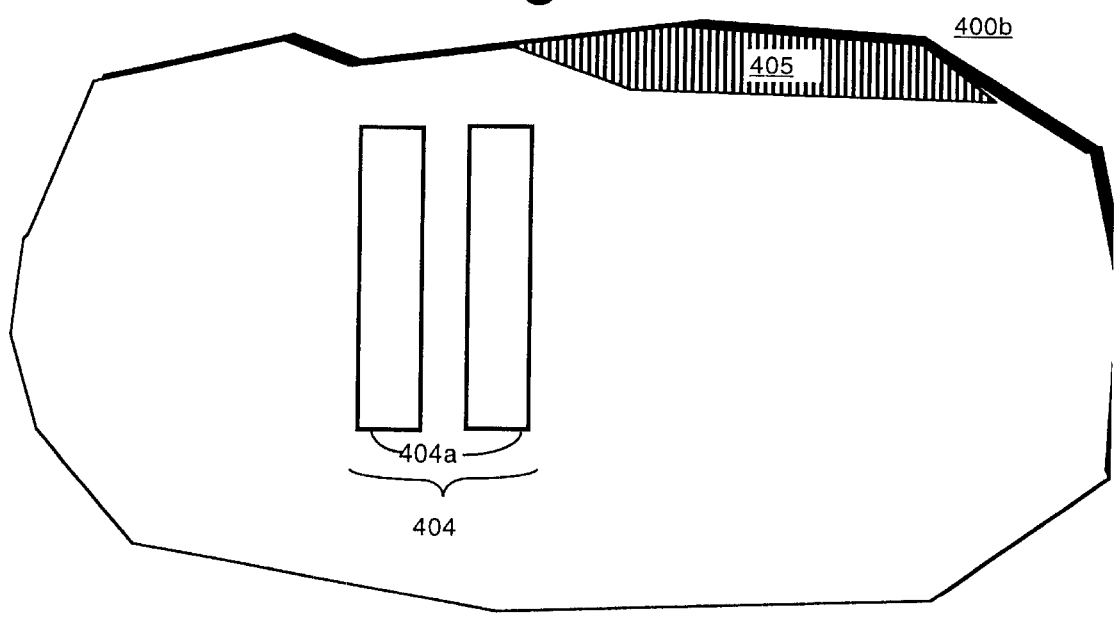
FIG. 4B is a reticle with offset multiple overlay boxes for use with a master alignment target, in accordance with one embodiment of the present invention.

Referring now to FIG. 4B, a reticle with offset multiple overlay boxes for a master alignment target is shown, in accordance with one embodiment of the present invention. Reticle 400b includes a pattern 404 having two overlay boxes 404a. Reticle 400a also includes a product pattern 405, of any configuration, that can be used to form an IC on the die portion of a wafer. However, the present invention does not require reticle 400b to have a product pattern 405. In one embodiment, pattern 404 is offset, relative to pattern 402 of reticle 400a. While the present embodiment presents a specific quantity, size, and shape of overlay boxes 404a, the present invention is well-suited to using any quantity, size, and shape of overlay boxes 404a.

Figure 4C:
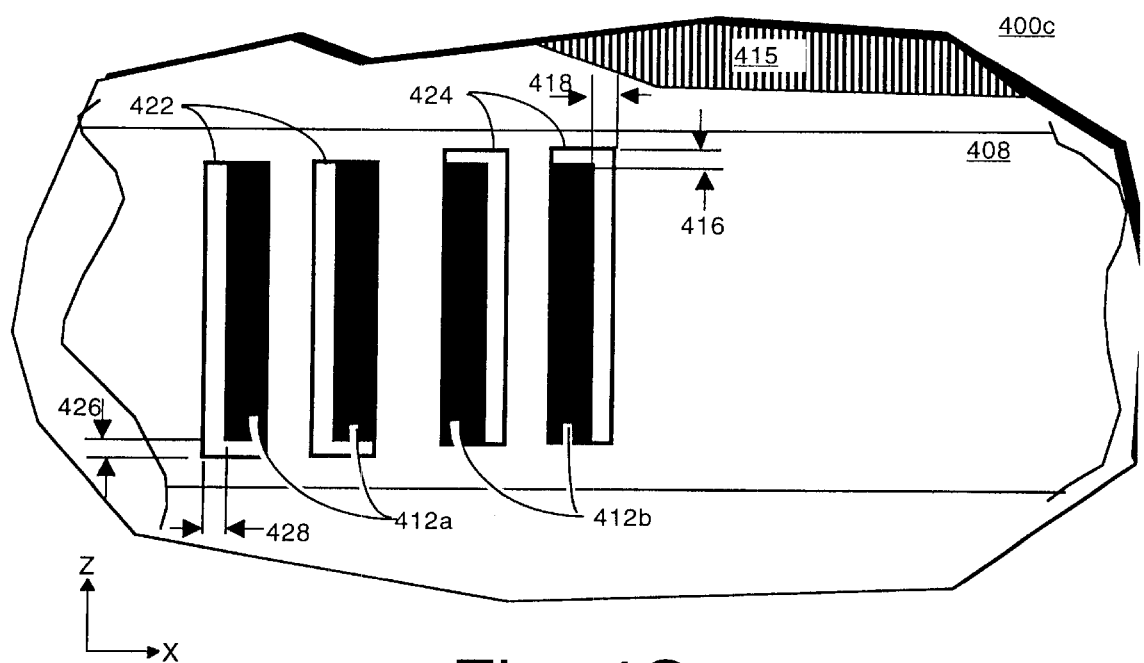
FIG. 4C is a wafer with multiple fine alignment targets and multiple overlay boxes formed therein, in accordance with one embodiment of the present invention.

Referring now to FIG. 4C, a wafer with multiple fine alignment targets and multiple overlay boxes formed therein is shown, in accordance with one embodiment of the present invention. Wafer 400c includes fine alignment target 412a and 412b having a first pattern 412a and second pattern 412b, located in scribe line 408. Wafer 400c also includes a product pattern 415, though it is not required for the present invention.

Figure 5:
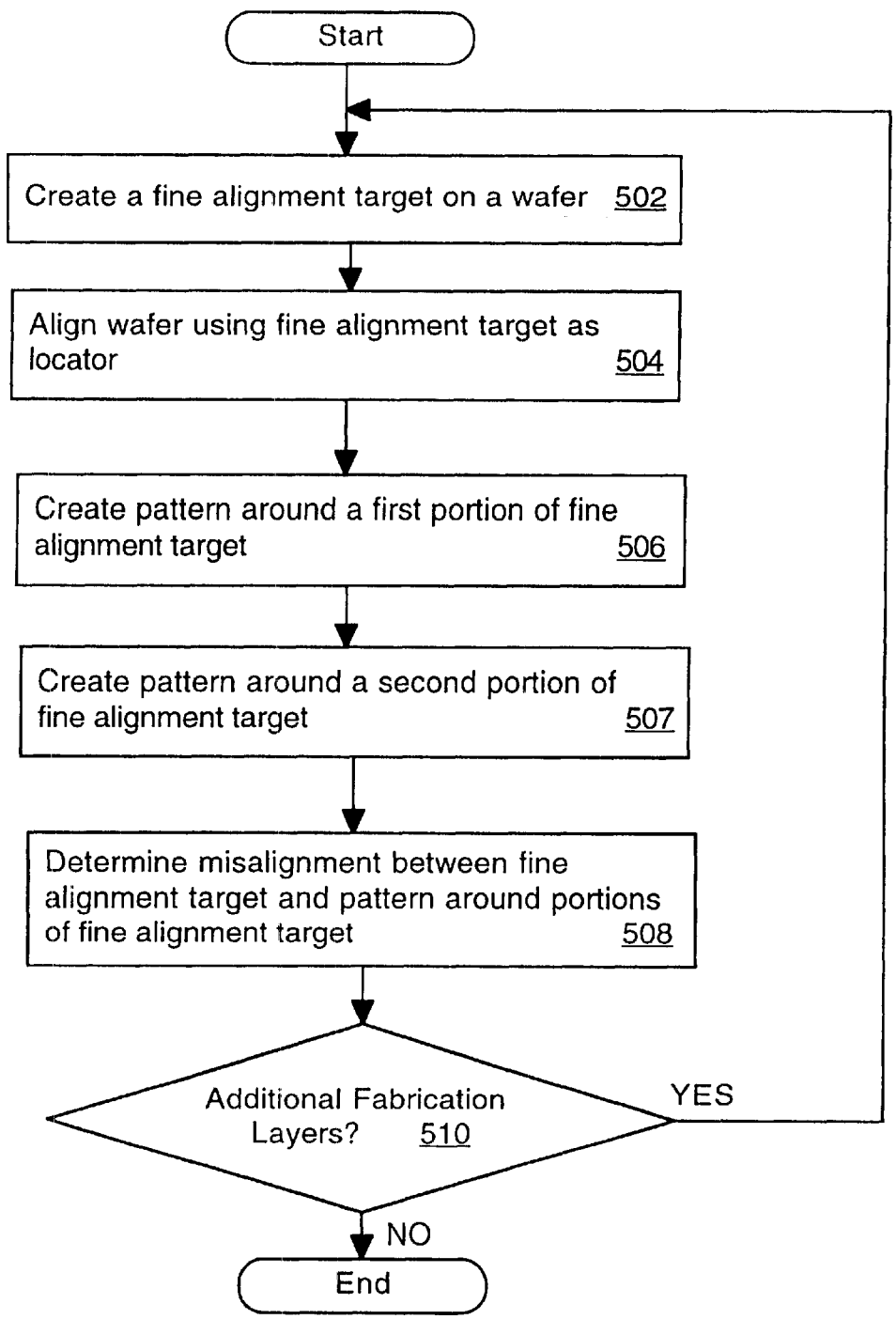
FIG. 5 is a flowchart of the steps performed to determine misalignment using a pattern and a master alignment target, in accordance with one embodiment of the present invention.

Referring now to FIG. 5, a flowchart of the steps performed to determine misalignment using a pattern and a master alignment target is shown, in accordance with one embodiment of the present invention. In one embodiment, flowchart 500 is used when precise alignment on a wafer is required between two or more layers that may be separated by multiple layers.

In step 502 of the present embodiment, a master fine alignment target is created on a wafer. Step 502 of the present embodiment is similar to step 302 of flowchart 300. However, the fine alignment target used in step 502 is referred to as a master fine alignment target because it is utilized for alignment on multiple layers on the wafer. One embodiment of step 502 uses reticle 200a with a master fine alignment target 202, as shown in FIG. 2A. Similarly, one embodiment of a wafer 200c having a master fine alignment target 222 formed therein is shown in FIG. 2C. While the present embodiments shows components of master fine alignment target as having a specific shape, e.g. rectangle, and a specific quantity of shapes, e.g. four, the present invention is suitable to a master fine alignment target having any type of shape and any quantity of shapes. In contrast, fine alignment target, for flowchart 300, is used by only a single layer in one embodiment. Following step 502, flowchart 500 proceeds to step 504.

In step 504 of the present embodiment, the wafer is aligned using the master fine alignment target. Step 504 of the present embodiment is similar to step 304 of flowchart 300. Following step 504, flowchart 500 proceeds to step 506.

In step 506 of the present embodiment, a first pattern is created around a first portion of the master alignment target corresponding to a given layer on a wafer. First pattern 402, shown as two overlay boxes 402a, of reticle 400a of FIG. 4A is one embodiment that implements step 506. FIG. 4C presents one embodiment that further implements step 506. In FIG. 4C, the first portion of the master alignment target are the first two shapes, or boxes, 422a. While FIG. 4C shows the final configuration of wafer 400c, after all layers have been placed on wafer, note that at step 506, overlay boxes 424 would not be present. In the present embodiment, two overlay boxes 402a from reticle 400a are used to form two overlay boxes 422 around first portion 412a of master fine alignment target 412a and 412b.

While the present embodiment for step 506 utilizes a specific quantity of shapes, e.g. two, of first portion of master fine alignment target, the present invention is well-suited to using any quantity of shapes, less than the total quantity of shapes, that make up master fine alignment target. By not using all the shapes that make up the master fine alignment target, some of the shapes are reserved for use by a subsequent layer of material to be deposited on the wafer. The present embodiment uses multiple shapes of master fine alignment target to provide an average value for misalignment. By using an average value of misalignment, the present embodiment helps to filter some of the noise, or unwanted variation, in the misalignment measurement process. Following step 506, flowchart 500 proceeds to step 507.

In step 507, a second pattern is created around a second portion of the master fine alignment target. This step is similar to step 506, but it utilizes shapes in master fine alignment target not utilized by step 506. Pattern 404 of reticle 400b in FIG. 4B can be utilized in one embodiment to implement step 507. The embodiment shown in FIG. 4C implements step 507 by creating a pattern, e.g. two overlay boxes 424, around a second portion 412b of master fine alignment target 412a and 412b on wafer 400c. In one embodiment, the size and shape of second pattern is similar to those of step 506. Step 507 corresponds, in one embodiment, to the application of a different pattern in a different layer of material than that for step 506. Additionally, interim layers and patterns can exist between the patterns and layers used for steps 506 and 507. The same alternatives provided in step 506 apply also to step 507. Following step 507, flowchart 500 proceeds to step 508.

In step 508, misalignment is determined between master fine alignment target and patterns created around the different portions of the master fine alignment target. FIG. 4C shows one embodiment of step 508. In FIG. 4C, first pattern 422 has an x-direction misalignment 428 and a y-direction misalignment 426, from first portion 412a of master fine alignment target 412a and 412b. The present embodiment shows the same x-misalignment and y-direction misalignment for both pairs of overlay boxes 422 and boxes of master alignment target 412a for clarity. In another embodiment, the x-direction misalignment and y-direction misalignment can be different values that can be averaged. Following step 508, flowchart 500 proceeds to step 510.

In step 510 of the present embodiment, an inquiry determines whether additional fabrication layers are required. If additional fabrication layers are required, then flowchart 500 returns to step 502. In this manner, the method implemented in flowchart 500 can be performed in a serial, or sequential fashion. However, the present invention is well-suited to implementing flowchart 500 in parallel on different areas of the wafer. If additional fabrication layers are not required, then flowchart 500 proceeds to end flowchart 500.

One benefit of the flowchart 500 embodiment of the present invention is that two patterns on two different layers of material on a wafer can be very closely aligned. In the prior art, a pattern on each layer of material would be aligned to a fine alignment target of the previous layer. Hence, the misalignment would be sequentially cumulative. An example will best illustrate the benefits of the present invention. Assuming a misalignment of $0.02\mu$ in one direction occurs between each adjacent layer formed on top of each other, then a pattern formed on the fifth layer of material on the wafer would be 0.1µ misaligned from the first layer for the prior art alignment method. If the master fine alignment target of the present invention were utilized for the patterns on the first and fifth layer, then the total misalignment between the first and fifth layer would only be 0.02µ. In a very sensitive device, the 0.02µ misalignment of the present invention might be acceptable where the 0.1µ misalignment of the prior art would be unacceptable. Hence, the present invention provides a method and apparatus for allowing very accurate alignment between two patterns on two different layers on a wafer, regardless of the quantity of layers between them.

Figure 6:
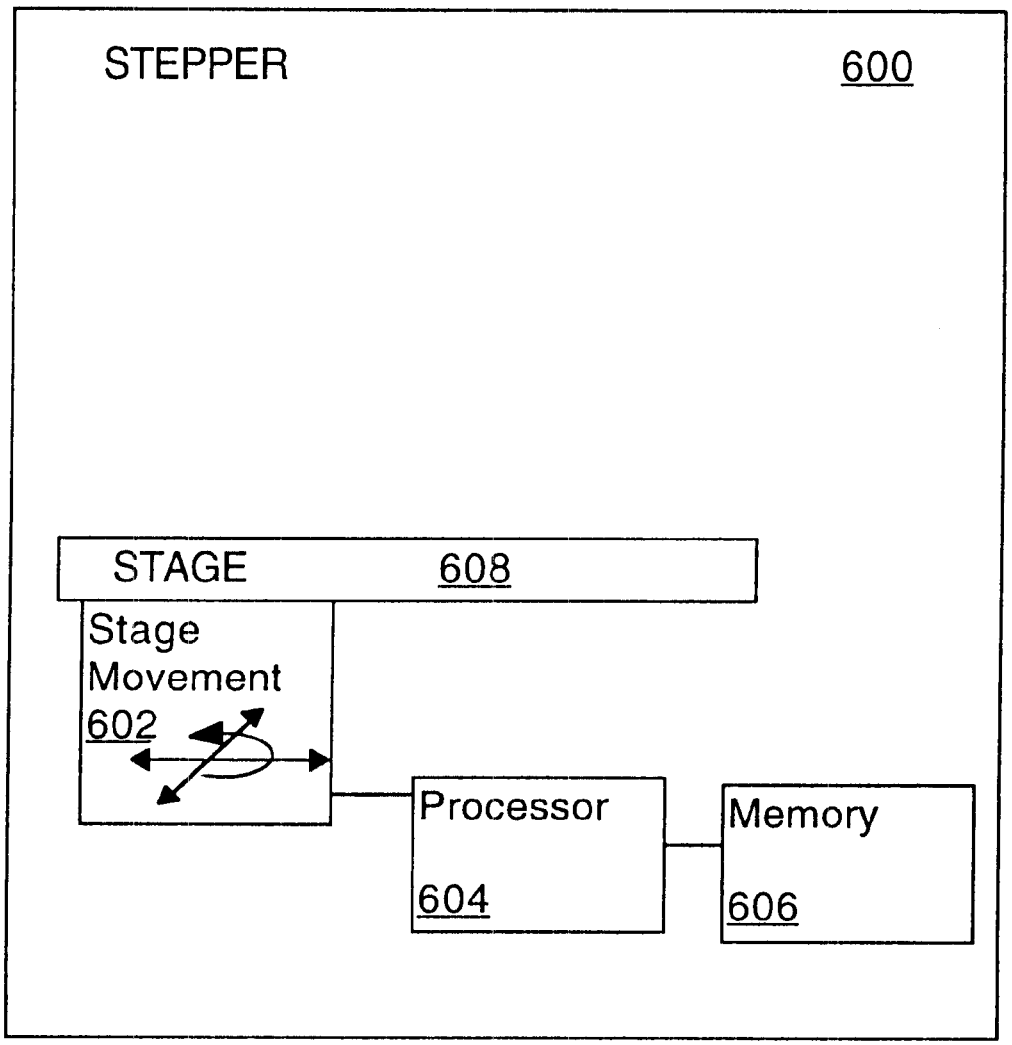
FIG. 6 is a stepper that incorporates the method for determining wafer misalignment using a pattern on a fine alignment target, in accordance with one embodiment of the present invention.

Referring now to FIG. 6, a stepper that incorporates the method for determining wafer misalignment using a pattern on a fine alignment target is shown, in accordance with one embodiment of the present invention. Stepper 600 includes a stage 608 coupled to a stage movement device 602, a processor 604, and a memory 606. Memory 606 contains program instructions that, when implemented through processor 604, allow stepper 600 to implement the steps used in the present invention to determine wafer misalignment using a pattern and a fine alignment target on a wafer.

In summary, the present invention provides an apparatus and a method for ensuring accurate alignment of multiple layers formed on a wafer. Additionally, the present invention provides a method that directly checks for misalignment between the layer formed by an overlay in a stepper to the alignment targets on the wafer. And the present invention reduce the size and quantity of the alignment structures, and the space which they consume, on the wafer. Additionally, the present invention provides a method and apparatus providing very accurate alignment between two patterns on two different layers on a wafer, regardless of the quantity of layers between them.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, to thereby enable others skilled in the art best to utilize the invention and various embodiments with various modifications as are suited to the particular use contemplated. It is intended that the scope of the invention be defined by the Claims appended hereto and their equivalents.

I claim:

1. A method of determining a misalignment between a first reticle and a wafer, said method comprising the steps of:
    a) receiving said wafer in a stepper, said wafer having an alignment target;
    b) aligning said wafer using said alignment target of said wafer as a locator;
    c) creating a first pattern around at least a first portion of said alignment target using said first reticle; and
    d) determining said misalignment between said alignment target and said first pattern created around said alignment target.

2. The method recited in claim 1 wherein said alignment target is a fine alignment target.

3. The method recited in claim 1 wherein said alignment target comprises a plurality of shapes.

4. The method recited in claim 3 wherein step c) comprises:
    c) creating said first pattern around each of said plurality of shapes of said alignment target.

5. The method recited in claim 1 further comprising the step of:
    e) creating a new alignment target for aligning a subsequent layer on said wafer.

6. The method recited in claim 5 further comprising the step of:
    f) creating a second pattern around a second portion of said alignment target using a second reticle.

7. The method recited in claim 6 further comprising the step of:
    g) measuring misalignment between said first reticle and said second reticle with respect to said wafer by measuring a difference in misalignment between said first pattern created by said first reticle on said wafer and said first portion of said alignment target, and between said second pattern created by said second reticle and said second portion of said alignment target.

8. The method recited in claim 1 wherein said first pattern is a box having a rectangular shape that is slightly larger than said alignment target.

9. The method recited in claim 1 wherein said alignment target is formed in said wafer using a frame outline.

10. The method recited in claim 1 wherein said first pattern is centered about said alignment target on said wafer.

11. The method recited in claim 1 wherein said first pattern is offset from said alignment target on said wafer.

12. A stepper for fabricating a wafer, said stepper comprising:
    a processor; and
    a computer readable memory, said computer readable memory coupled to said processor, said computer readable memory including program instructions stored therein are executable to determine misalignment between a reticle and an alignment target when said wafer is received in the stepper and aligned therewith utilizing said alignment target as a locator and a pattern is created around at least a first portion of said target using said reticle.

13. The stepper recited in claim 12 wherein said alignment target comprises a plurality of shapes.

14. The stepper recited in claim 13 wherein said pattern is created around each of said plurality of shapes of said alignment target.

15. The stepper recited in claim 13 wherein said program instructions in said computer readable memory unit are executable to determine said misalignment for each of a plurality of fabrication operations performed on said wafer corresponding to a plurality of alignment targets.

16. The stepper recited in claim 12 wherein said alignment target and said pattern around said alignment target are located in a scribe line of said wafer.

17. The stepper recited in claim 12 wherein said pattern is a box having a rectangular shape that is slightly larger than said alignment target.

18. The stepper recited in claim 12 wherein said pattern is formed using a frame having a rectangular shape slightly larger than said alignment target.

19. The stepper recited in claim 12 wherein said pattern is centered about said alignment target.

20. The stepper recited in claim 12 wherein said pattern is offset from said alignment target.

21. A method of determining a misalignment between a reticle and a wafer in a stepper, said method comprising the steps of:

a) receiving said wafer, said wafer having a fine alignment target located in a scribe line of said wafer, said fine alignment target having a plurality of rectangular shapes;

b) aligning said wafer in said stepper using said fine alignment target on said wafer as a locator;

c) creating an overlay box around each of said plurality of rectangular shapes of said fine alignment target using said reticle;

d) determining said misalignment between each respective one of said plurality of rectangular shapes of said fine alignment target and said respective overlay box; and e) repeating steps a) through d), for a subsequent reticle used on a subsequent layer.

* * * * *